WITNESSES:
Bernard R. Gieguey
James F. Young

INVENTOR
William E. Newell
BY
Gordon H. Telfer
ATTORNEY

United States Patent Office 3,513,356

Patented May 19, 1970

3,513,356

ELECTROMECHANICAL TUNING APPARATUS PARTICULARLY FOR MICROELECTRONIC COMPONENTS

William E. Newell, Murrysville, Pa., assignor to Westinghouse Electric Corporation, Pittsburgh, Pa., a corporation of Pennsylvania Filed June 27, 1967, Ser. No. 649,214
Int. Cl. H03h *7/10*
U.S. Cl. 317—101 1 Claim

ABSTRACT OF THE DISCLOSURE

Tuning apparatus is described including a vibratory member on which layers of piezoelectric material are disposed for input and output transducers. The vibratory member may have a flat surface on which the piezoelectric layers are disposed making the structure amenable to fabrication by techniques used for fabrication of microelectronic components. The vibratory member may be a body of semiconductive material. In addition to acting as an electromechanical tuning element, the vibratory member, when of semiconductive material, may contain elements such as an integrated amplifier circuit with frequency selective properties without external tuning means.

BACKGROUND OF THE INVENTION

Field of the invention

The invention relates to tuning elements for electronic apparatus and specifically to electromechanical tuning elements. The apparatus of the invention is particularly suitable for microelectronic applications including but not limited to the provision of tuning means within or integral with, semiconductive integrated circuits.

Description of the prior art

There has been a continuing search for a means for tuning integrated circuits without external elements. For various reasons considerable attention has been focused on electromechanical resonators to solve the problem. By way of background, reference should be made to articles by Newell appearing in: Electronics, pages 50–52, Mar. 13, 1964; Proc. IEEE, V. 52, pages 1603–1608, December 1964; and Proc. IEEE, V. 53, pages 1305–1309, October 1965.

Some devices based on this approach have been previously disclosed. Among these are the use of face mounted piezoelectric resonators as described in an article by Newell appearing in Proc. IEEE, V. 53, pages 575–581, June 1965, and also in application Ser. No. 415,913, filed Dec. 4, 1964 and assigned to the present assignee.

Another approach is that of the resonant gate transistor (or RGT) as described in an article by Nathanson and Wickstron appearing in Applied Physics Letters, V. 7, pages 84–86, Aug. 15, 1965 and also in application Ser. No. 465,090, filed June 18, 1965 and assigned to the present assignee.

Still another approach is that which has been termed the "resonister" as described in an article by Wilfinger et al. appearing in Proc. IEEE, pages 1589–1591, November 1966.

These various approaches to electromechanical tuning of microelectronic circuits have inherent drawbacks limiting their applicability. All of these devices, as well as the ones with which the present invention is concerned, generally comprise (1) an input transducer which converts the input electrical signal to a mechanical vibration, (2) a mechanical resonator, and (3) an output transducer to convert the vibration into an output electrical signal. Various electromechanical coupling mechanisms can be used for transducers and various modes of acoustic vibration can be used in the resonator giving considerable flexibility in particular implementations. However, the size, frequency range, ease and economy of fabrication, insertion loss, dynamic range, applicability of desirable material properties and avoidance of undesirable properties, all are crucially affected by the choice of particular mechanisms and configurations of elements.

For a better understanding of the nature, purposes, and advantages of the present invention it is believed desirable to briefly summarize the mechanisms, advantages, and disadvantages of the previously disclosed electromechanical resonator about 36 p.p.m./° C. and the device may be completely monolithic. Among its disadvantages, however, are that the thermal input mechanism is very inefficient leading to about 60 db of insertion loss and relatively great power dissipation. Also thermal diffusion requires the device to be of relatively large size, for example 300 mils length, and to resonate at low frequencies, such as several tens of Kilohertz. Also it has not yet been disclosed how to make the structure amenable to batch fabrication.

In addition there have been previously disclosed electromechanical resonant apparatus not particularly directed to microelectronic or integrated circuit applications. Piezoelectric transducers are frequently employed for supplying the input and deriving the output signals from such devices. An example of such a device is described in an article by Mason et al. in IRE Trans. Ultrasonics Engr., V. UE–7, pages 59–70, June 1960. Such devices typically use quartz or ferroelectric ceramic transducer elements which are fabricated separately and then bonded to the resonator structure. Due to lack of ease of batch fabrication and the technological processes required, such concepts are not directly applicable to tuning elements in microelectronic applications.

Therefore, the principal objects of the present invention are to avoid the shortcomings of the prior art, particularly in providing tuning apparatus for microelectronic circuitry, by combining in one structure qualities of advantageous fabrication and operation.

SUMMARY OF THE INVENTION

Tuning apparatus is described including a vibratory member on which one or more layers of piezoelectric material are disposed for input and output transducers. The vibratory member may have a flat surface on which the piezoelectric layers are disposed making the structure amendable to fabrication by techniques used for fabrication of microelectronic components. The material of the vibratory member may be variously selected but included among the preferred embodiments are those in which the vibratory member is of semiconductive material. In addition to acting as an electromechanical tuning element, the vibratory member or the mounting for it, when of semiconductive material, may contain active and passive elements such as an integrated amplifier circuit with frequency selective properties without external tuning means. Also, the vibratory member and the piezoelectric material may be selected so that net temperature coefficient of frequency of the structure is very low as by selecting a vibratory member having a positive temperature coefficient that is offset by the negative temperature coefficient of the piezoelectric material. Various arrangements for supporting the vibratory member are disclosed including use of nodal support as well as by effectively clamping one or both ends of the member. Also the use of notches is disclosed for stress concentration and for advantageous location of the piezoelectric transducer layers.

DESCRIPTION OF THE PREFERRED EMBODIMENTS

Devices in accordance with this invention, sometimes for convenience referred to as "tunistors," have particular interest for purposes of tuning semiconductor integrated circuits and will accordingly be initially described in such embodiments although various other configurations apart from those particularly applicable to integrated circuitry are within the scope of the invention.

Figure 1:
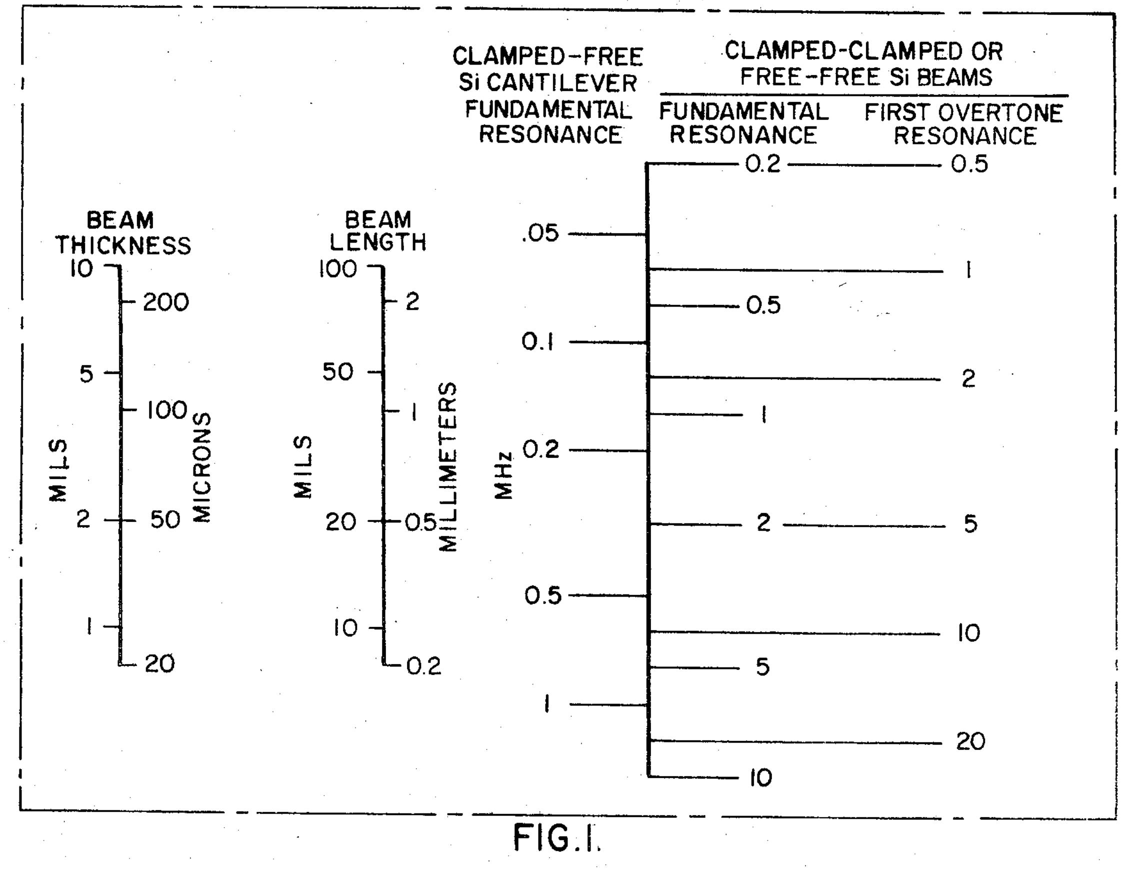
FIG. 1 is a nomograph providing information with respect to the resonant frequencies of uniform silicon beams of various dimensions with various combinations of clamped and free ends.

FIG. 1 shows a nomograph which gives the approximate fundamental and first overtone resonant frequencies for uniform silicon cantilevers and for uniform silicon beams clamped or free at both ends. This information is driectly calculable by considering the speed of sound in silicon that is known to be about 8500 meters per second. Because in the final configuration the entire resonant structure is not wholly of silicon, the values of FIG. 1 are merely approximate but are useful for design purposes. Also, of course, the use of silicon is merely by way of example and is of particular interest because of the widespread use of silicon in the fabrication of integrated circuits and the fact that one of the primary intentions of this invention is to provide tuning means compatible both in size and in fabrication technology with present day semiconductor integrated circuits.

As appears from FIG. 1, resonant frequencies up to about 10 megahertz can be achieved with practical dimensions, including the two popular frequencies for IF amplifiers, 455 kilohertz for standard AM receivers and 10.7 megahertz for FM receivers, and also many single sideband and Doppler radar frequencies. The AM broadcast band also lies in this range, making possible a fixed-tuned radio-on-a-chip.

Figure 2:
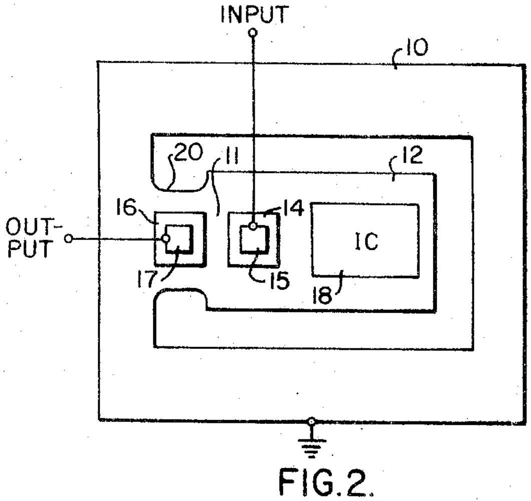
FIGS. 2, 3, 4 and 5 are plan views of alternative embodiments of the present invention.

Taking the embodiment of FIG. 2 as an example, there is shown a body 10 of a semiconductive material such as silicon in which a cantilever beam 12 has been produced as by etching away the silicon during which an oxide etching mask may be used. Other techniques such as ultrasonic drilling, back sputtering, and stamping may alternatively be used to form the beam. On the surface 11 of the beam itself are disposed first and second layers 14 and 16 of piezoelectric material to provide input and output transducers respectfully with electrical contact means 15 and 17 disposed on each of the layers. The underlying silicon provides a common electrode in this embodiment although it is to be understood that a separate electrical contact could be provided with isolation from the silicon itself. Within a portion of the beam is delineated an area 18 identified as an IC meaning that within this portion may be fabricated by the techniques presently used in integrated circuitry the active and passive elements of the, for example, amplifier circuit for which the tunistor is to provide the tuning means.

One may start, for example, with the silicon die having a thickness of about 6 mils and etch through it, possibly using masking and etching from both major surfaces, to fabricate a notched cantilever of about 60 mils length to provide a resonant frequency of about 50 kilohertz.

The beam surface area is sufficient in order to fabricate active and passive elements of a semiconductor integrated circuit as well as to provide input and output transducer elements by the deposition of a film of piezoelectric material such as of cadmium sulfide utilizing techniques as are described in de Klerk, et al., Rev. Sci. Instruments, v. 36, pages 506–510; April 1965 and Foster, Proc. IEEE, v. 53, pages 1400–1405; October 1965.

The structure of FIG. 2 is merely illustrative. In practice it would be undesirable to have electrical lead wires bonded directly to the contacts on the vibratory member because of their effect on resonance. It is preferred merely to have conductive interconnection running over the surface of the member to bending pads on the peripheral supporting material where lead attachment is made.

The relative sizes of the piezoelectric layers and IC in FIG. 2 is not crucial but it would be preferred in most instances to maximize the transducer area. The piezoelectric layers may be disposed over the IC employing some dielectric layer therebetween for isolation; or the IC may itself be disposed within the peripheral supporting material rather than in the vibratory member itself.

FIG. 2 also illustrates the concept of providing considerable improvement in device characteristics through the use of a beam having appropriately located notches 20 rather than a uniform beam. The notches tend to increase the local stresses so that by placing the output transducer at a notch, the sensitivity can be increased. At the same time, stresses are reduced elsewhere, making it possible to fabricate integrated circuitry on a portion removed from the notch with less concern for the effect of the stresses there. Additionally, the notches can be designed to accentuate a desired mode of resonance while minimizing undesirable modes, thereby reducing spurious responses. Furthermore, if an antisymmetric mode of vibration is used, differential output transducers can be used to cancel the signal induced by symmetric vibration modes excited externally. A secondary effect of the notches is to lower the resonant frequency, probably at most by a factor of about two in practice, but this can be compensated for by reducing the length from that given by FIG. 1.

Figure 3:
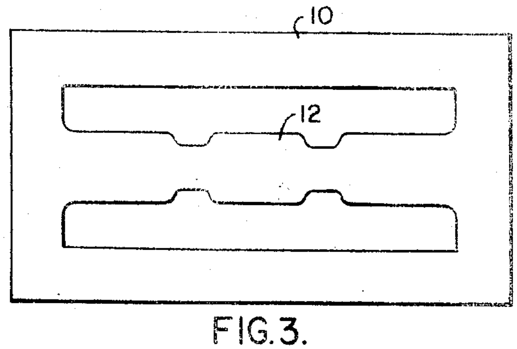

The embodiment of FIG. 3 is generally similar and the input and output transducers and integrated circuit are not specifically delineated. FIG. 3, however, does illustrate the employment of a clamped-clamped mode of beam mounting notched to accentuate the first overtone mode of resonant vibration. For a thickness of about six mils and a beam length of about 20 mils the resonant frequency will be approximately 10.7 megahertz.

In the embodiments of this invention it is also to be recognized that the integrated circuit need not be disposed directly on the vibrating member. It may for example be positioned on the peripheral material of body 10 which is not at all subject to vibration and thus permit free vibration of the resonant beams.

Figure 4:
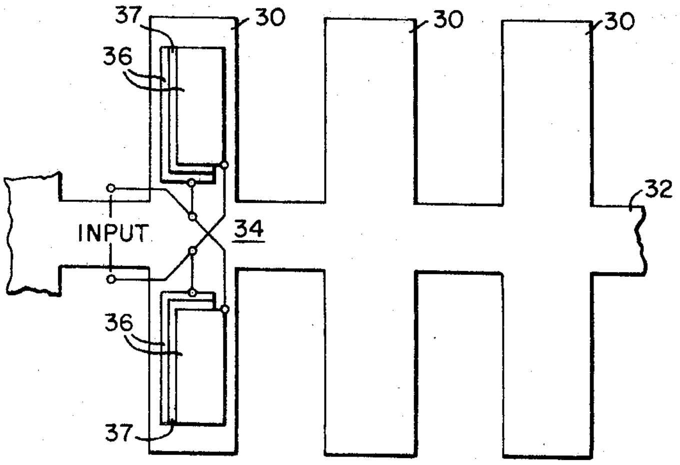

FIG. 4 shows a design that may be used for a multiple torsional resonator. A plurality of beams 30 extend from a central beam axis 32 which is mounted at both ends, only one end being shown in the figure. Torsional vibrations can be excited and/or detected, for example, by a single or by a double "bimorph" layer of piezoelectric material, to be subsequently described. To cause rotation, the polarity of the two sides of a transducer 34 should be opposing. This can be achieved either by reversing the polarity of the piezoelectric film 37 or by reversing the polarity of the electrode 36 as illustrated in FIG. 4. FIG. 4 illustrates only one of the transducer elements that would be disposed on the torsional resonator. The elements of transducer 34 are shown offset merely for illustration purposes.

In connection with FIG. 4 it should be noted that the fabrication of multi-resonant flexural, torsional, longitudinal or shear mode structures similar to those which have been developed in much larger sizes, as in the above referred to article by Mason et al., makes the invention quite flexible in achieving various resonant characteristics. When three or more resonators are coupled, the achievement of a smooth band-pass frequency response requires that the end resonators have carefully controlled loading which is considerably greater than that of the intermediate resonators. This excess loading could be obtained by fabricating an integrated feedback loop into the silicon end beams. These loops would each consist of a vibration sensor, an amplifier and a driving transducer, with the loop gain and phase adjusted to give the desired damping (similar to the stabilizer servos used to damp the roll of ships).

It is possible that the electromechanical coupling resulting from the use of a piezoelectric transducer may make it possible to obtain sufficient damping directly with a load resistor.

These damping techniques would, of course, also be applicable to single resonators in place of, or in addition to, damping by encapsulation in a viscous fluid.

Figure 5:
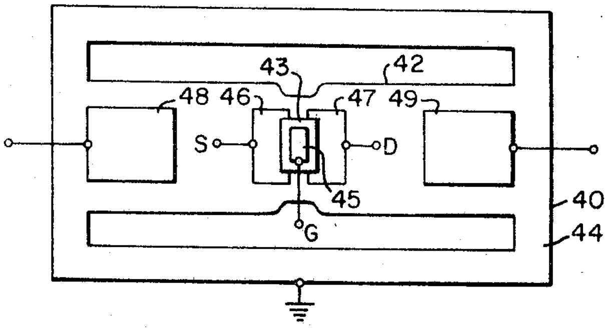

FIG. 5 illustrates a relatively simple, complete, tunistor element which is proposed to demonstrate the principles of the invention. The device is fabricated on a body 40 of low resistivity silicon such as having a resistivity of 10 ohm-cm. or less. This material acts as a common ground electrode. After etching the slots which define the resonant beam 42, a cadmium sulfide layer 44 is deposited over the entire silicon wafer. This cadmium sulfide film should be well oriented with the *c*-axis perpendicular to the surface and have a high resistivity. The thickness is not crucial, but a thickness of several microns is suggested. On top of the cadmium sulfide, two metal electrodes 48 and 49 which form blocking contacts (of, for example, gold) and two which form ohmic contacts 46 and 47 (of, for example, aluminum) are deposited as shown in the figure. Also, an insulated gate electrode 45 is deposited on an oxide layer 43 over the channel. This tunistor can be operated using piezoelectric input and output transducers and applying the input signal to a first electrode 48 and taking the output from the second electrode 49. Alternatively, it may be desired for improved efficiency to tie the electrodes 48 and 49 together at the input and use electrodes 46 and 47 in the field effect structure as source and drain electrodes of a stress sensitive field effect transistor output transducer similar to that described by Muller, et al., IEEE Trans. on Electron Devices, V. ED–12, pages 590–596; November 1965. In this case the source electrode 46 would be grounded and the drain electrode 47 would be connected to a bias supply in series with an appropriate load resistor. For a silicon thickness of about 6 mils and a beam length of about 60 mils, this tunistor should resonate near the popular IF amplifier frequency of 455 kilohertz.

In general, a variety of transducers may be used with various beam configurations in accordance with this invention. A piezoelectric film such as one of cadmium sulfide can be deposited on the silicon, as also may appropriate metal electrodes. Although such piezoelectric films tend to grow with the *c*-axis perpendicular to the substrate, flexural vibrations can be generated or detected by means of the $k_{31}$ coupling, which is about 12% in cadmium sulfide.

An even more efficient piezoelectric transducer for flexural vibration is possible using two films polarized in opposite directions to give "bimorph" action. By way of further example an extremely thin intermediate layer of lead sulfide is found to cause reversal in the polarization of cadmium sulfide or zinc sulfide piezoelectric films. Since the above referred to piezoelectric transducers are bilateral, they may be used at the input and/or the output. Other active transducers are applicable at the output and might give high overall efficiency. For example, if cadmium sulfide input transducers are used, active cadmium sulfide output transducers could be deposited simultaneosly to form a device such as is shown in FIG. 5. It is also possible to use other active output transducers utilizing the effects of stress on PN junction characteristics that may be diffused directly into the silicon body and which may take configuration such as those described in an article by Rindner et al. in Jour. Appl. Phys., v. 34, pages 1958–1970, July 1963 and in an article by Legat et al. in Solid-State Electronics, v. 8, pages 709–714, 1965.

In the definition of this invention with respect to the use of piezoelectric input and output transducers all of such mechanisms are intended to be included as well as other equivalent structures.

To summarize the invention in connection with the provision of integrated circuit tuning means by the present invention, the devices described here combine the advantages and eliminate the disadvantages of previous electromechanical tuners for compatible incorporation in silicon integrated circuits. The use of silicon for the resonator is desirable because of its low temperature coefficient of frequency and because its high acoustic velocity permits fabrication of resonators in the very popular frequency range from 50 kilohertz to 10 megahertz which was not practical for previous devices. Notches in the beam may be used to accentuate particular modes of vibration and to increase the stresses at the desired locations. Piezoelectric transducers are used in the embodiments of this invention to decrease the insertion loss and to avoid the need for a bias voltage or current as required by previous devices, with the resulting effect on resonant frequency of this bias. Also, batch fabrication is possible because a large plurality of such units may be simultaneously fabricated from a single wafer of semiconductor material and subsequently separated. The silicon material required to provide the tuning element and its support may be efficiently utilized because most of it is available for integration of other circuit elements.

While the invention is particularly attractive for the provision of tuning means in semiconductor integrated circuits, it is also possible to provide single component resonators by this invention on a microelectronic scale that are useful as separate components. Advantage may still be taken of batch fabrication procedures including the formation of transducers by the deposition of piezoelectric films.

When fabrication of such resonant elements is considered apart from semiconductor material limitations a wide choice of attractive metals is made possible. These include some with thermal frequency stability, particularly including those nickel-iron alloys such as are available under the trade names "Ni-Span-C," "Vibralloy" and "Elinvar." The temperature frequency stability of such metals is discussed in an article by Fine et al., Jour. of Metals (AIME), v. 3, pages 761–764; September 1951.

It is particularly desirable to employ such alloys which can be treated to achieve a positive temperature coefficient of frequency just sufficient to cancel the negative temperature coefficient resulting from the cadmium sulfide or other piezoelectric film transducers. Therefore, a device with a temperature coefficient of frequency of nearly zero, at least under 10 parts per million per degree centigrade, is possible.

Additionally, it is to be recognized that while the resonant frequencies of a resonator having both ends free and one having both ends clamped are identically the same, the free-free resonator offers attractive opportunities because of the possibility of supporting it in the vicinity of nodal lines for the desired mode of operation.

Figure 6:
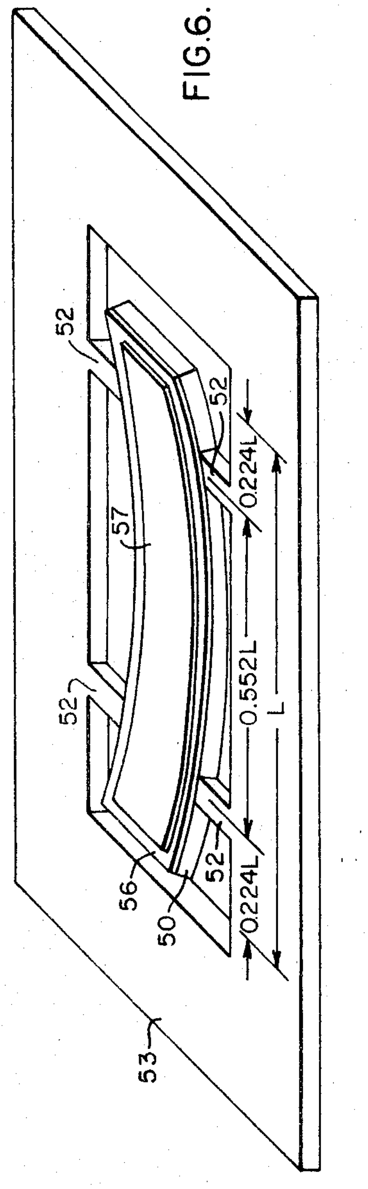
FIGS. 6 and 7 are perspective views of additional alternative embodiments of the present invention.
Figure 7:
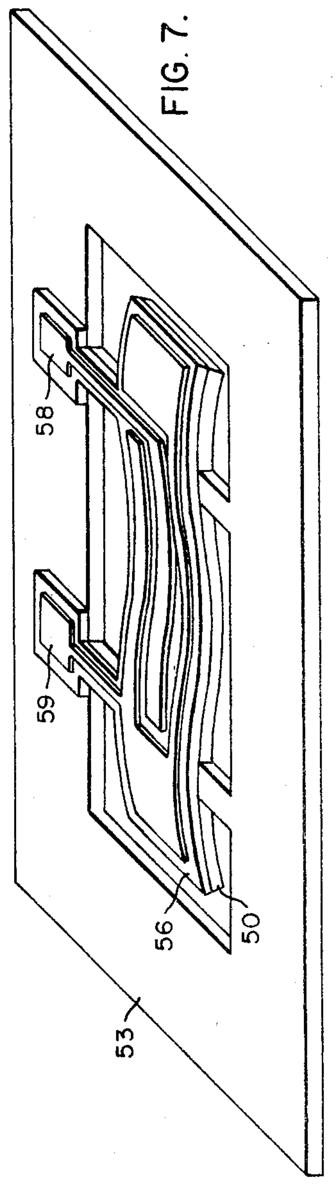

FIG. 6 shows a general configuration for such a resonator with relative dimensions. Beam 30 is supported by nodal supports 52 which are part of a thin flat plate 53. The frequency of this resonator is determined by the formula $$f=1.03\frac{d}{L^2}\sqrt{Y/\epsilon}$$

where $d$ is the thickness, L is the length, Y is Young's modulus and $\epsilon$ is the mass density. Illustrated here is a single piezoelectric film 56, for example, cadmium sulfide, on the surface of a metallic resonator that may be of the material previously mentioned, thus providing a two terminal resonator with the metal film 57 disposed on the surface of the piezoelectric layer. Additionally, the upper electrode 57 may be subdivided for various inputs and )utputs. FIG. 7 illustrates a similar structure with separate nput and output electrodes 57 and 58 on the piezoelectric ilm 56. This design has a number of potential advantages, ncluding the ability to control Q by means of the width )f the nodal supports and the ability to design the output :lectrode to reduce vibration sensitivity and overtone 'esponse.

The latter mentioned advantage depends on the fact :hat because of the nearly balanced support arrangement, :xternal vibration is relatively inefficient in exciting the :undamental mode of resonance. Because of symmetry, he first and all successive odd overtone modes are not :xcited and are not sensed by an output transducer cen- :ered along the length of the resonator. The first mode )f vibration which is strongly excited by external vibra- :ion is the second overtone, which is 5.40 times the funda- nental in frequency but only 1 over $5.40^2$ or 0.0343 as great in relative amplitude. Furthermore, since the curva- :ure near the center of the resonator vibrating in this node is opposite to the curvature near the ends, the ength of the output transducer can be designed to cancel uny output which otherwise would occur from this mode. For a uniform free-free resonator, the output transducer should cover about 56% of the length, as is illustrated in FIG. 7 by way of further example. Therefore, the net :esult is a planar electromechanical filter which is almost :otally immune to excitation from external vibration.

Figure 8:
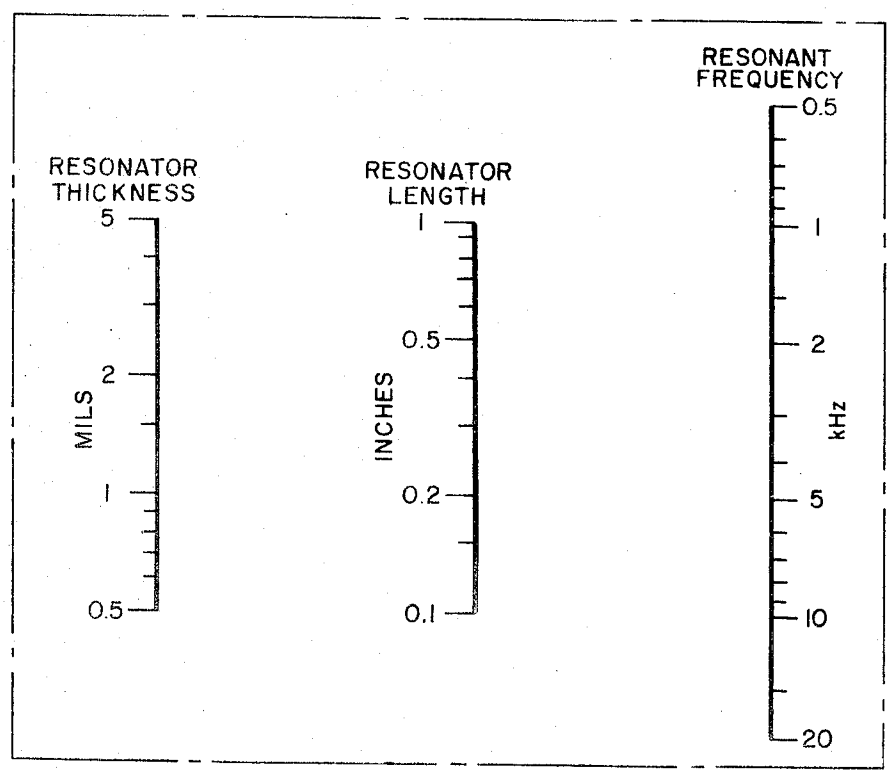
FIG. 8 is a nomograph indicating the resonant frequency of the resonator of Ni-Span-C alloy mounted with free ends.

Resonators of this type should be applicable in a wide variety of miniaturized timing and filter circuits. They should be especially attractive in applications where vibra- :ion and shock immunity is necessary, for example, fuzes, where cost and size are critical factors, for example in un electronic watch or clock, where a number of stable liscrete channels are desired, for example, frequency nultiplex, remote control tones over a power line, etc. :t is believed that the seven resonators for a pushbutton :elephone could be simultaneously batch fabricated in a netal foil less than one square inch in area. The size )f resonators for use at other frequencies can be estimated :rom the nomograph in FIG. 8.

In summary, therefore, the latter discussed resonators, while not directly incorporated into integrated circuits, )ermit capabilities developed for the batch fabrication of ntegrated circuits to be applied in another field where he cost of obtaining the desired precision and small size 1as hindered the use of tuning forks in many otherwise attractive applications. In combination with integrated :ircuits these miniaturized resonators should make many 1ew applications economically feasible.

By way of further example free-free tunistors of one nil thick stainless steel have been demonstrated. The ength of a typical resonator was 0.375 inch, giving a :esonant frequency of about 2 kilothertz. The resonator was mounted by nodal supports as shown in FIG. 6. The :ntire structure including beam 50, nodal supports 52 and the peripheral support 53 were formed from a single sheet of metal by etching using a photoresist mask. A cadmium sulfide layer 56 approximately eight microns thick was applied to an entire surface of the structure. Two separate contacts (in practice, like contact 57 divided into two approximately equal portions with the gap between them running along the length of the beam) were applied to the beam. The device was tested by applying a variable frequency signal to one of the upper contacts and viewing the output signal from the other contact on an oscillo- scope. The devices were found when operated in air to provide Q's of about 200 to 600, which was increased by a factor of about 2 when operated in vacuum.

While the invention has been shown and described in a few forms only, it will be apparent that other changes and modifications may be made without departing from the spirit and scope thereof.

I claim:

1. Electromechanical tuning apparatus comprising: a first member of semiconductor material, said first member having a positive temperature coefficient of frequency, said first member mounted on a support to permit vi- bration, a unitary body of semiconductive material in- cluding a piezoelectric field effect transducer integrally united with said first member, a first layer of piezoelectric material on said first member, first electrical contact means on said first layer for application of electrical sig- nals thereto to produce mechanical stress transmitted to said first member; a second layer of piezoelectric material on said first member, spaced from said first layer, re- sponsive to stress transmitted by said first member; said first and second layers of piezoelectric material having a negative temperature coefficient of frequency, a second electrical contact means on said second layer for deriving an output electrical signal and electrically interconnected with said piezoelectric field effect transducer.

References Cited

UNITED STATES PATENTS

| | | | |
|---|---|---|---|
| 3,414,832 | 12/1968 | Newell | 333—30 |
| 3,413,573 | 11/1968 | Nathanson | 332—31 |
| 3,334,307 | 8/1967 | Blum | 330—5.5 |
| 3,411,023 | 11/1968 | Quate | 310—8 |
| 3,243,769 | 3/1966 | Trott | 340—10 |
| 3,200,354 | 8/1965 | White | 333—30 |
| 3,360,749 | 12/1967 | Sittig | 333—30 |

HERMAN KARL SAALBACH, Primary Examiner

C. BARAFF, Assistant Examiner

U.S. Cl. X.R.

310—8.1; 317—235; 330—31